United States Patent [19]

Hull et al.

[11] Patent Number: 4,519,086

[45] Date of Patent: May 21, 1985

[54] MOS PHASE LOCK LOOP SYNCHRONIZATION CIRCUIT

[75] Inventors: Richard W. Hull, Mission Viejo; Leonard Teslenko, Fountain Valley, both of Calif.

[73] Assignee: Western Digital Corporation, Irvine, Calif.

[21] Appl. No.: 388,899

[22] Filed: Jun. 16, 1982

[51] Int. Cl.³ .............................................. H03L 7/06
[52] U.S. Cl. ..................................... 375/120; 328/63; 328/133; 331/57; 331/177 R; 360/51; 329/104
[58] Field of Search ............. 331/57, 175, 176, 108 C, 331/177 R, 1 A; 328/61, 63, 209, 133, 155; 307/491, 494, 497, 289; 375/120, 80, 81, 82, 119; 360/51; 329/104, 110, 122, 124

[56] References Cited

U.S. PATENT DOCUMENTS

| | | | |
|---|---|---|---|
| 3,708,757 | 1/1973 | Savarese et al. | 331/57 |
| 3,978,431 | 8/1976 | Lattin | 331/108 C |
| 4,052,673 | 10/1977 | Herzog | 331/57 X |
| 4,083,020 | 4/1978 | Goldberg | 331/108 C |
| 4,215,430 | 7/1980 | Johnson, Jr. | 375/120 X |
| 4,422,176 | 12/1983 | Summers | 375/120 |

FOREIGN PATENT DOCUMENTS 2255  1/1977  Japan ..................................... 331/57
35504  4/1981  Japan ..................................... 331/57

OTHER PUBLICATIONS

E. K. Woo, "Variable-Frequency and Pulse-Width Logic Oscillator", IBM TDB, vol. 14, No. 6, Nov. 1971, pp. 1937-1938.

*Primary Examiner*—Benedict V. Safourek
*Attorney, Agent, or Firm*—Spensley Horn Jubas & Lubitz

[57] ABSTRACT

A metal oxide semiconductor (MOS) phase lock loop data synchronization circuit, for use in conjuction with an integrated circuit disk controller device, comprising a temperature, process, and voltage compensated MOS voltage controlled oscillator (VCO), a three-bit counter, and a phase detector circuit. The phase detector circuit compares a decoded clock signal output from the VCO with incoming data from a disk device to detect phase differences between the frequency of the VCO and the actual frequency of the incoming data. The phase detector produces voltage signals in response to any such phase differences, which are coupled to the VCO and alter the frequency output of the VCO to match the frequency of the incoming data. The counter provides a system read-clock, which is fully synchronized with the incoming data, to an integrated circuit disk controller device which further processes the data.

2 Claims, 6 Drawing Figures

PHASE LOCK LOOP

COUNTER & PHASE DETECTOR

TIMING DIAGRAM

VOLTAGE CONTROLLED OSCILLATOR

VARIABLE RESISTANCE CIRCUIT

MOS PHASE LOCK LOOP SYNCHRONIZATION CIRCUIT

BACKGROUND OF THE INVENTION

1. Field of the Invention

This invention relates to an electronic circuit for use with magnetic disk storage devices, and in particular to a phase lock loop data synchronization circuit for use in an integrated circuit disk drive controller device.

2. Prior Art

For many years, magnetic disk systems have been used as data storage devices for computer systems. In particular, flexible, or "floppy", disk systems have become popular on-line storage devices for minicomputer and microcomputer systems. In the industry at present, most floppy disks are recorded using a frequency modulated (FM) data format, or a modified frequency modulated (MFM) data format. In both of these formats, data is stored and retrieved along with clocking signals as a self-clocking serial data stream on individual tracks of a floppy disk. Relatively recently, both of these data formats also have been used with certain hard disk systems and cartridge tape systems.

In both the FM and MFM data formats, each disk track is broken into sectors. Each sector is considered to be comprised of "bit cells", which define the locations on the track on which data bits may be written or read by a controller circuit. In the FM data format, each bit cell begins with a clock pulse and the contents of the center of the bit cell defines the data. If the data bit is equal to a binary zero, no pulse is written in the center of the cell. If the data is equal to a binary one, a pulse is written. For a typical eight-inch floppy disk device, each clock pulse is written four microseconds apart.

In the MFM data format, clock pulses are encoded into the data stream, and the bit cells are not physically delimited on a disk track by clock pulses. Instead, bit cells are defined relative to one another. A data bit is written into the center of a bit cell if the data is equal to a binary one, and a clock pulse is written at the leading edge of a bit cell if the preceding and succeeding data bits are both binary zero. With the MFM data format, the bit cell size is equivalent to two microseconds, but actual clock or data pulses may be two, three, or four microseconds apart. In MFM, twice as much data can be recorded without increasing the frequency rate in comparison with the FM data format.

In reading FM or MFM encoded data, both clock pulses and data pulses are read as a single serial input stream by a controller circuit. It therefore is necessary to synchronize the operation of the controller circuit to the input data pulses in order to distinguish between clock pulses and data pulses. Due to variations caused by motor speed fluctuations, read amplifier recovery circuits, and bit shifts caused by magnetic dipole repulsion of the actual magnetic domains comprising the data and clock pulses, the input pulses will tend to drift away from their nominal position on a disk track in comparison to a controller circuit Read Clock having a frequency directly related to the nominal frequency of the bit cells. Thus, a means must be used to achieve synchronization between the frequency of the Read Clock and the combined data and clock pulses being read from a disk track. One method of achieving this synchronization in the past has been a phase lock loop (PLL) circuit. However, past PLL circuits have been external to single integrated circuit disk controller devices, such as the Western Digital FD179X family of controller devices. These external PLL circuits have required a great deal of printed circuit board space, components, and engineering design effort. For example, one such external PLL circuit requires six to eight integrated circuits and numerous other active and passive electronic components.

It is thus an object of the present invention to provide an on-chip phase lock loop data synchronization circuit in conjunction with an integrated circuit disk controller device. Such an integrated circuit has the advantage of eliminating the engineering required to build an external PLL circuit, and of significantly reducing the cost of a disk controller by reducing the size of the needed printed circuit board and eliminating numerous external components.

SUMMARY OF THE INVENTION

The objects of the present invention are achieved with a phase lock loop data synchronization circuit fabricated on an N-type metal oxide semiconductor (MOS) integrated circuit disk controller device. The basis for the PLL circuit is a voltage controlled oscillator (VCO) comprising a five-stage ring counter and a variable-resistance sub-circuit. The NMOS variable-resistance sub-circuit and the first stage of the ring counter are specially designed to compensate for process variations in the threshold voltage of the enhancement and depletion devices used therein, for temperature variations in component parameters, and for process variations in the sheet resistance of the semiconductor material used in manufacturing the integrated circuit.

The novel features which are believed to be characteristic of the invention, both as to its configuration and method of manufacture, together with further objectives and advantages thereof, will be better understood from the following description considered in conjunction with the accompanying drawings. The drawings illustrate a presently preferred embodiment of the invention by way of example. It is to be expressly understood, however, that the drawings are for the purposes of illustration and description only and are not intended as a definition of the limits of the invention.

BRIEF DESCRIPTION OF THE DRAWINGS

Like numbers in the various figures refer to like elements.

DETAILED DESCRIPTION OF THE PREFERRED EMBODIMENT

Figure 1:
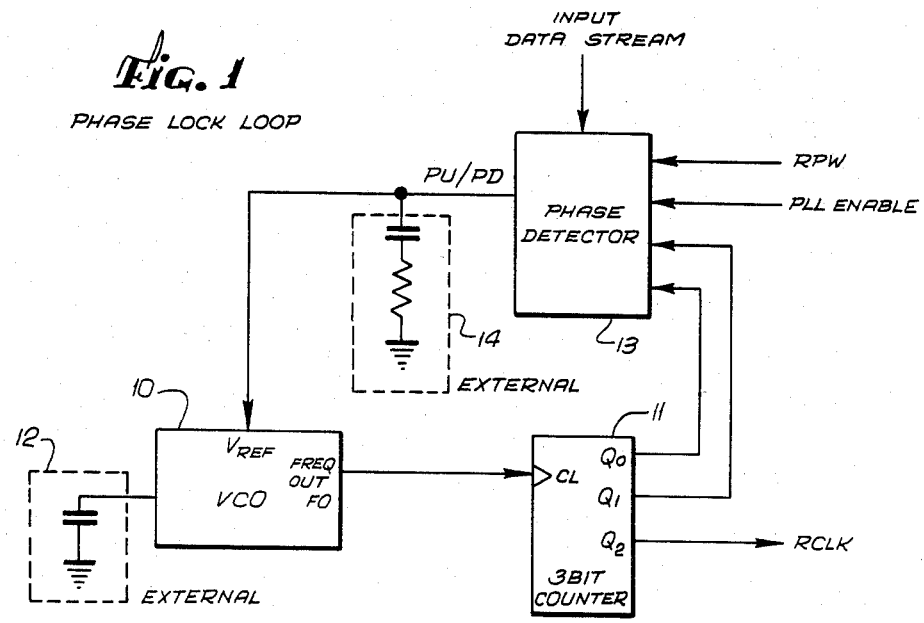
FIG. 1 is a block diagram of the phase lock loop data recovery circuit of the present invention.

FIG. 1 is a block diagram of the PLL circuit of the preferred embodiment of the present invention. A voltage controlled oscillator (VCO) 10 provides a clock signal output FO that is sent to a 3-bit synchronous counter 11. The VCO 10 also is coupled to an external capacitor 12. The external capacitor 12 determines the nominal frequency at which the VCO oscillates (four megahertz in the present embodiment). If different input data rates must be accommodated, the VCO 10 is set for the highest frequency needed and optional frequency division circuits are placed between the clock output FO and the input of the counter 11.

One output of the counter 11 is the controller circuit Read Clock (RCLK), which has a nominal frequency of 500 kilohertz. Additional outputs, $Q_0$ and $Q_1$, of the counter 11 are received and decoded by a phase detector circuit 13. The phase detector 13 compares the input data stream against a reference gating signal derived from the $Q_0$ and $Q_1$ inputs from the counter 11 to determine if the input data frequency has shifted from its nominal value. If a shift in frequency is detected, the phase detector 13 sends a correction signal, PU/PD, to the VCO 10, which changes the frequency of its output FO in response thereto. Hence, the frequency of RCLK is also changed.

Figure 2:
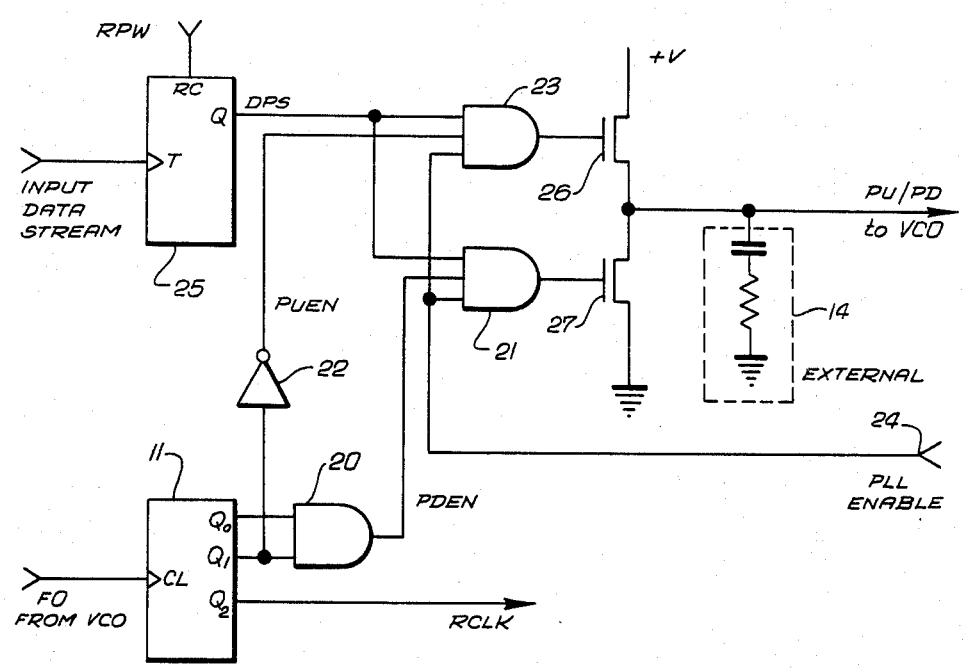
FIG. 2 is a schematic logic diagram of the phase detector circuit of the present invention.

FIG. 2 shows a schematic logic diagram of the counter 11 and phase detector circuit 13 of the present invention. The $Q_0$ and $Q_1$ outputs of the counter 11 are decoded by AND gate 20, whose output (PDEN) is an input to AND gate 21. The $Q_1$ output of the counter 11 is inverted by inverter 22, the output of which (PUEN) is an input to AND gate 23.

A PLL Enable signal 24 is an input to both AND gates 21 and 23. The PLL Enable signal 24 permits other circuitry of the disk controller integrated circuit to control the operability of the PLL data synchronization circuit. AND gates 21 and 23 are enabled when the PLL Enable signal 24 is a logical "1".

The serial input data stream read from a disk track is one of the inputs to a retriggerable one-shot device 25. Because the serial input data stream may have variable-width pulses, the input pulses are shaped by the one-shot 25 to produce a uniform width Data Pulse Signal (DPS) as its output. A second input to the one-shot 25 is an external Read Pulse Width (RPW) voltage input, which determines the width of the DPS signal. Optimal performance in the present embodiment is achieved when the RPW signal is adjusted such that the pulse width of DPS is equal to ⅛ of the pulse width of RCLK. The DPS output of the one-shot 25 is an input to both AND gate 21 and AND gate 23.

The output of AND gate 23 controls the gate of a field effect transistor ("FET") 26, the input of which is coupled to a positive voltage supply. The output of AND gate 21 controls the gate of a second FET 27, whose input is coupled to ground and whose output is coupled to the output of FET 26. FET 26 and FET 27 comprise a switchable voltage pulse generator whose output, PU/PD, is the voltage feedback input to the VCO 10. When the outputs of both AND gates 21 and 23 are both logical "0", both FET 26 and FET 27 are nonconductive, and the PU/PD voltage floats at a nominal bias voltage determined in the VCO 10. When the output of AND gate 23 alone is a logical "1", FET 26 becomes conductive and causes a positive-going voltage pulse signal on the PU/PD output. When the output of AND gate 21 alone is a logical "1", FET 27 becomes conductive and causes a negative-going (relative to the nominal floating voltage of PU/PD) voltage pulse signal on the PU/PD output.

Figure 3:
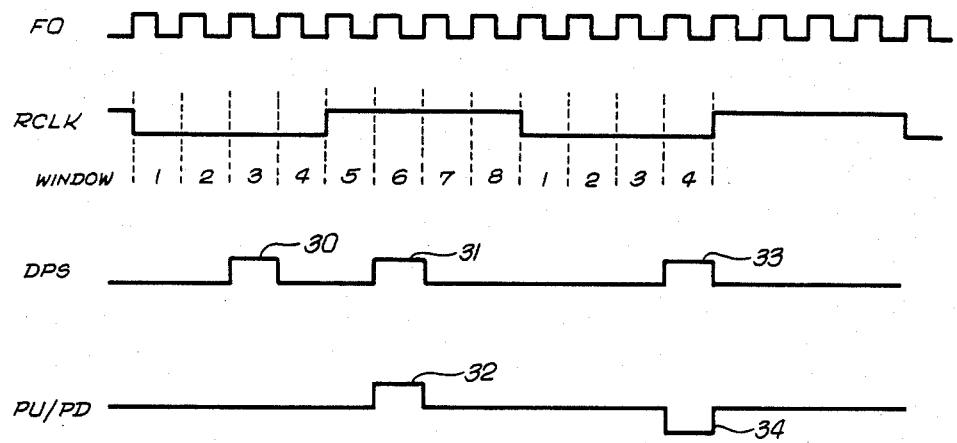
FIG. 3 is a timing diagram of the phase detector circuit of the present invention.

FIG. 3 is a timing diagram of the DPS and PU/PD outputs of the phase detector 13 relative to FO and to the RCLK output of the counter 11. It can be considered that RCLK is divided into eight synchronized "windows" by the PDEN and PUEN signals in conjunction with AND gates 21 and 23. Windows 1, 2, 5, and 6, created by the PUEN signal and AND gate 23, are referred to as "pump-up" windows. Windows 4 and 8, created by the PDEN signal and AND gate 21, are referred to as "pump-down" windows. Windows 3 and 7 are referred to as "no-pump" windows. The phase detector 13 compares each DPS pulse with the PUEN and PDEN windows generated by AND gate 20 and inverter 22. If a DPS pulse 30 falls within windows 3 or 7 (the no-pump windows), the PU/PD output is left floating at a nominal voltage value, since the VCO 10 is operating at the same frequency as the incoming data stream pulses. However, if a DPS pulse 31 coincides with windows 1, 2, 5, or 6, a "pump-up" positive-going voltage pulse from FET 26 is generated at the PU/PD output of the phase detector 13 and sent to the VCO 10. This pump-up signal causes the VCO 10 to increase its frequency. Because the VCO 10 output frequency FO increases, the frequency of RCLK also increases, and keeps synchronized with the input data stream.

If a DPS pulse 33 coincides with windows 4 and 8, a "pump-down" negative-going voltage pulse 34 from FET 25 is sent to the VCO 10. This pump-down signal causes the VCO 10 to decrease its frequency. Again, the change in the output frequency FO of the VCO 10 causes a change in the frequency of RCLK, which thus remains synchronized with the input data stream.

The PU/PD output of FET 26 and FET 27 is coupled to an external resistor-capacitor series integrating circuit 14 to control the response characteristics of the PU/PD signal. The values of the RC circuit are choosen for a desired VCO response to short term or instantaneous effects. The value of the capacitor yields the time constant determining the long term effect of the PU/PD signal on the VCO 10 response. This time constant is the phase lock loop response time and for a floppy disk application is about three byte lengths (24 bit cells) in the FM data format mode.

Figure 4:
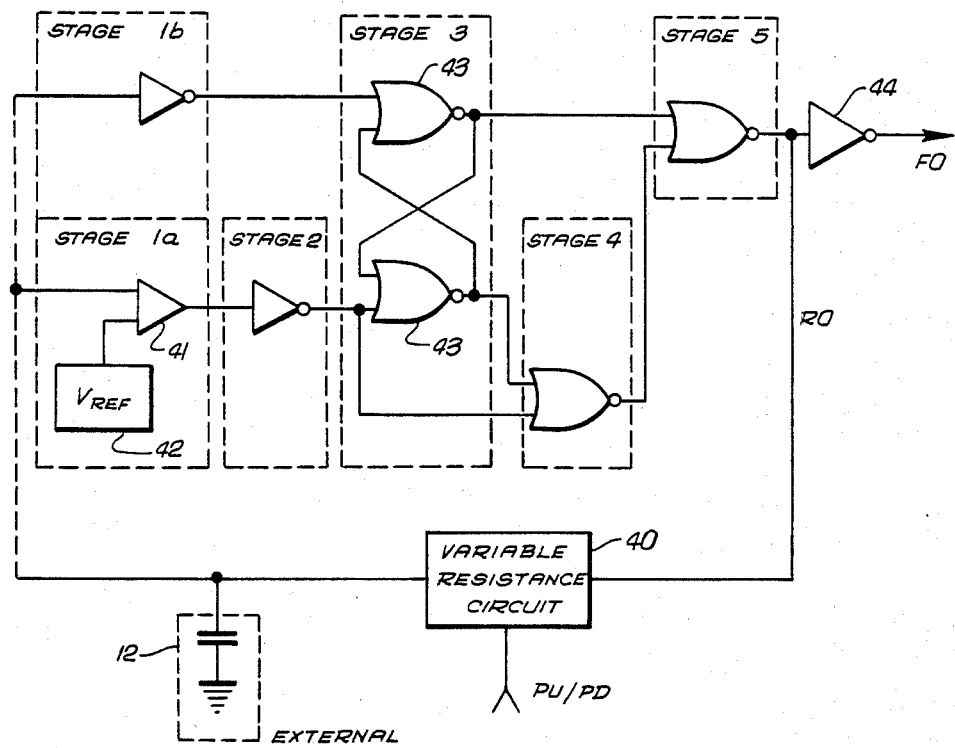
FIG. 4 is a schematic logic diagram of the voltage controlled oscillator of the phase lock loop data synchronization circuit of the present invention.

FIG. 4 is a schematic logic diagram of the VCO 10. The phase lock loop requires a stable VCO for reliable operation with respect to variations in supply voltage and temperature. Further, the PLL circuit must be reproducible within the systematic variations that occur during MOS device fabrication. The VCO 10 of the present invention comprises a 5-stage ring oscillator with three important modifications: A voltage, temperature, and process compensated variable RC subcircuit 40 in the feedback between Stage 5 and Stage 1 to control the rate of oscillation of the VCO 10 in response to the PU/PD signal from the phase detector 13; a voltage, temperature, and process compensated Stage 1; and a cross-coupled latch 43 in Stage 3 feeding Stages 4 and 5.

A ring oscillator typically comprises a series of inverter stages with the last stage supplying negative feedback to the first stage. The speed of operation, or frequency, of a ring oscillator is dependent upon the signal propagation delay through all stages, as determined by the number of stages, the device sizes, any RC-induced time delay in the circuit, and fabrication process parameters. In the preferred embodiment, the ring oscillator output RO of Stage 5 is coupled to Stage 1 through a variable resistance circuit 40. An external capacitor 12 is coupled to the input of Stage 1 of the VCO 10, and in conjunction with the variable resistance circuit 40, determines the nominal free-running frequency of the VCO 10. An inverting buffer 44 has been added after Stage 5 of the ring oscillator to produce the frequency output FO from RO, and to send the FO signal to the 3-bit counter 11, as shown in FIG. 1.

Figure 5:
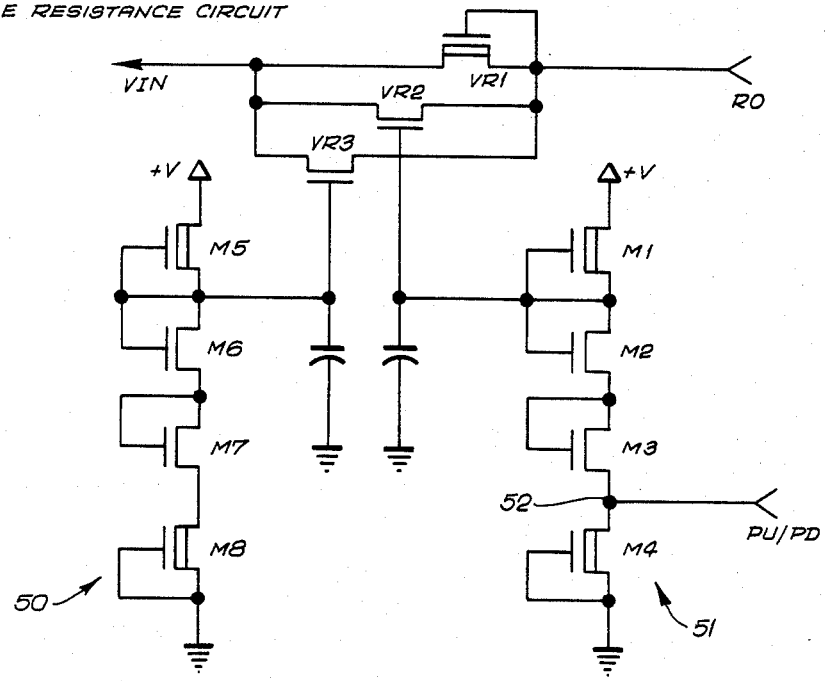
FIG. 5 is a schematic diagram of the variable resistance sub-circuit in the voltage controlled oscillator circuit of the present invention.

FIG. 5 is a schematic circuit diagram of the variable resistance circuit 40 of FIG. 4. In the variable resistance circuit, three resistance devices, VR1, VR2, and VR3, are coupled in parallel. The three devices comprise a variable resistance network in an RC circuit with external capacitor 12. The output, VIN, of the resistance circuit 40 is the input to Stage 1 of the VCO 10.

VR1 is a depletion-mode MOS device used to provide some waveshaping of the RO signal, decreasing the rise time of the signal. VR1 also provides a maximum on-resistance for the resistance circuit 40, preventing loss of VCO oscillation.

VR2 and VR3 are enhancement-mode MOS devices both biased by identical-device resistance voltage divider networks 50 and 51. The divider networks 50, 51 are designed to provide compensation for parametric variations in device performance that occur during MOS processing. Typically, such variations in performance are uniform throughout a MOS integrated circuit. Of particular importance is compensating for variations in the enhancement voltage threshold (VTe) of the MOS devices. Variations in VTe occur from temperature and voltage changes in the circuit, as well as from process variations during fabrication.

The Threshold Voltage Bias Network 50 is particularly adapted to compensate for variations in VTe in the circuit devices. Enhancement devices M6 and M7 cause a decrease in the bias voltage to VR3 in proportion to a decrease in the VTe of the MOS devices. The decrease in bias to VR3 increases its resistance, thereby changing the frequency of the VCO 10, and thus countering the increase in speed in the inverter stages of the VCO that a decrease in VTe would otherwise cause. Conversely, devices M6 and M7 cause an increase in the bias voltage of device VR3 as VTe increases due to temperature or process variations, thereby decreasing the resistance of VR3 and changing the frequency of the VCO 10 accordingly.

Enhancement devices M2 and M3 of the PU/PD Bias Network 51 also compensate for variations in VTe in a manner similar to devices M6 and M7, by varying the bias voltage to VR2 in proportion to changes in VTe.

The PU/PD Bias Network 51 also serves as the input to the resistance circuit 40 of FIG. 4 for the PU/PD signal from the phase detector circuit 13. The circuit node 52 between devices M3 and M4 normally floats at a nominal DC voltage. The PU/PD Bias Network 51 supplies a bias voltage to device VR2, causing it to have an on-resistance such that the VCO 10 oscillates at its nominal frequency during "no-pump" windows in the phase detector circuit 13. Pump-up and pump-down signals cause the bias voltage from the PU/PD Bias Network 51 to device VR2 to vary in response thereto, causing the resistance of VR2 to change accordingly and alter the frequency of the VCO 10.

Figure 6:
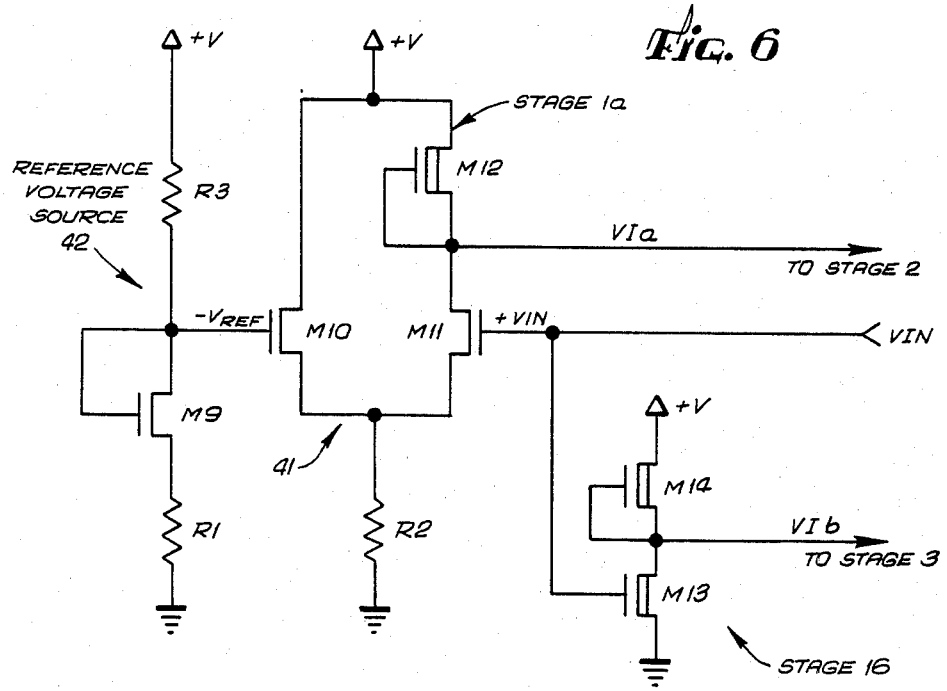
FIG. 6 is a schematic diagram of the circuitry comprising the first stage of the voltage controlled oscillator of the present invention.

FIG. 6 is a schematic circuit diagram of Stage 1 of FIG. 4.

A Reference Voltage Source 42 provides a reference voltage VREF to one input of a differential voltage comparator 41, which comprises Stage 1a of the VCO 10 ring oscillator. The other input of the voltage comparator 41 is the VIN signal from the RC circuit comprising the external capacitor 12 and variable resistance circuit 40 of FIG. 4. The output of Stage 1a, V1a, is connected to Stage 2, and changes in response to the relative voltages of VREF and VIN. Thus, if VIN is less than VREF, output V1a is a logical "1". If VIN is greater than VREF, output V1a is a logical "0". By controlling the magnitude of VREF, variations in the VTe of the circuit devices with temperature and processing can be minimized so that the oscillation frequency of the VCO 10 is uniform.

The VIN signal from the resistance circuit 40 of FIG. 4 is also an input to Stage 1b. Stage 1b connects directly to Stage 3 and acts essentially as a "set" signal to the cross-coupled latch of Stage 3. Stage 2, which is connected between Stage 1a and Stage 3, essentially acts as a "reset" signal to Stage 3.

Stage 1b has a lower trip-point voltage than Stage 1a. Thus, as the VIN signal changes from a logical "0" state to a logical "1" state, Stage 1b changes state before Stage 1a. Conversely, as the VIN signal changes from a logical "1" to a logical "0", Stage 1a changes state before Stage 1b. Stage 1a and Stage 1b thus effectively have a hysteresis characteristic that minimizes the effects of noise voltage spikes to which the circuit may be subjected.

The Stage 1a voltage comparator 41 is designed to maintain a constant trip-point voltage over extremes in temperature and MOS processing variations. Overall temperature stability is achieved by matching the operating characteristics of enhancement devices M9, M10, M11, and M13 so that temperature or process induced changes in the VTe of each device remains essentially constant with respect to the VTe of the other devices. Some temperature compensation is also achieved by choosing a large size for device M9 in the Reference Voltage Source 42, which minimizes changes in its on-resistance. As the VTe of device M9 decreases due to increasing temperature, the VREF trip-point voltage to Stage 1a is reduced to counter the slowing of the other inverter stages. That is, as the temperature increases, the VREF trip-point voltage is reduced so that Stage 1a triggers earlier to compensate for the slower action of the remaining inverter stages of the ring oscillator.

Matching the enhancement devices in the Reference Voltage Source 42, Stage 1a, and Stage 1b maintains the hysteresis characteristics of Stage 1a and Stage 1b independent of changes in VTe with processing. Resistors R1 and R3 in the Reference Voltage Source 42 are matched to resistor R2 in the voltage comparator 41 to accommodate changes in the sheet resistivity of the polysilicon used in fabricating the MOS integrated circuit. The values of R1 and R2 determine the amount of hysteresis by maintaining the trip-point voltage of Stage 1a higher than the trip-point voltage of Stage 1b.

Stage 3 of the ring oscillator is a cross-coupled latch to insure self-sustaining oscillation. Otherwise, in a five-stage ring oscillator, "half-bits" (spurious signals) can propagate through all stages before the next cycle of oscillation, thereby terminating oscillation.

While a wide variety of circuits and other configurations can be used in this invention, it should be understood that changes can be made without departing from the spirit or scope of the invention. For example, the invention may be fabricated in PMOS or CMOS circuitry with appropriate changes known in the art. Furthermore, variations in the VCO 10 circuitry are possible through various well-known design choices. Thus, this invention is not to be limited to the specific embodiment discussed and illustrated herein, but rather by the following claims.

We claim:

1. An improved phase detector circuit comprising:
   (a) a variable voltage controlled oscillator having a variable resistance means for varying the frequency of the oscillator output signal in response to a voltage correction signal;
   (b) counter means for receiving the output signal from the oscillator, for generating during each four clock cycles of the oscillator output signal a first phase detection enable signal during every fourth clock cycle, and a second phase detection enable signal during every first and second clock cycles, and further for generating a clock output;
   (c) a signal shaping means for receiving a data input signal of approximately the same frequency as the clock output of the counter means and for generating an approximately uniform width data output signal;
   (d) a first logical AND gate means for receiving the data output signal and the first phase detection enable signal and generating a first phase difference signal;
   (e) a second logical AND gate means for receiving the data output signal and the second phase detection enable signal and generating a second phase difference signal; and
   (f) a switchable voltage pulse generator comprising first and second transistor means in series coupled respectively to the output of said first and second logical AND gates, with the junction of the first and second transistors being coupled to the variable resistance means of the oscillator, for generating and transmitting a voltage correction signal to the variable resistance means of the oscillator in response to the presence of the first or second phase difference signals, wherein the voltage correction signal causes the variable resistance means to change the frequency output of the variable voltage controlled oscillator, thereby causing the clock output of the counter means to become synchronized with the frequency of the input data signal.

2. An improved metal oxide semiconductor (MOS) 5-stage voltage controlled ring oscillator, comprising:
   (a) A two-part first stage comprising an inverter for receiving a feed-back signal, and a differential voltage comparator means for receiving the feedback signal and a reference voltage signal and adapted to compensate for variations in the threshold voltage of the MOS devices used in the ring oscillator caused by changes in temperature, voltage, or fabrication processing parameters;
   (b) a second stage comprising an inverter coupled to the output of the differential voltage comparator of the first stage;
   (c) a third stage comprising a cross-coupled latch circuit, coupled to the output of the inverter of the first stage and to the output of the second stage, for preventing loss of oscillation in the ring oscillator;
   (d) a fourth stage comprising a logical NOR gate coupled to an output of the third stage and to the output of the second stage;
   (e) a fifth stage comprising a logical NOR gate coupled to a second output of the third stage and to the fourth stage; and
   (f) a variable resistance means connecting the fifth stage of the ring oscillator to the first stage, for providing the feed-back signal to the first stage and for varying the frequency of the ring oscillator output signal in response to an external voltage signal, wherein the variable resistance means is adapted to compensate for variations in the threshold voltage of the MOS devices used in the ring oscillator and caused by changes in temperature, voltage, or fabrication processing parameters.

* * * * *